United States Patent [19]

Moyer et al.

[11] Patent Number: 5,430,403
[45] Date of Patent: Jul. 4, 1995

[54] FIELD EFFECT TRANSISTOR WITH SWITCHABLE BODY TO SOURCE CONNECTION

[75] Inventors: James C. Moyer, San Jose; Harry J. Bittner, Santa Clara, both of Calif.

[73] Assignee: Micrel, Inc., San Jose, Calif.

[21] Appl. No.: 124,133

[22] Filed: Sep. 20, 1993

[51] Int. Cl.⁶ .................. H01L 25/00; H03K 9/08
[52] U.S. Cl. .................. 327/365; 327/566; 327/38
[58] Field of Search ............ 307/304, 303.2, 303, 307/303.1, 296.2, 243; 328/104, 154

[56] References Cited

U.S. PATENT DOCUMENTS

| | | | |
|---|---|---|---|
| 4,675,561 | 6/1987 | Bowers | 307/304 |
| 4,700,125 | 10/1987 | Takata | 307/304 |
| 4,924,111 | 5/1990 | Anderson | 307/303.2 |
| 5,296,723 | 3/1994 | Nobe | 257/82 |
| 5,317,180 | 5/1994 | Hutter | 257/337 |

*Primary Examiner*—William L. Sikes
*Assistant Examiner*—Tiep Nguyen
*Attorney, Agent, or Firm*—Skjerven, Morrill, MacPherson, Franklin & Friel; Brian D. Ogonowsky

[57] ABSTRACT

To avoid forward biasing the diodes within an N-channel transistor, the body and source of the N-channel transistor are switchably connected via a high-voltage FET. The gates of the N-channel transistor and high-voltage transistor are connected together so that both transistors are on or off simultaneously. When both transistors are on, the high-voltage transistor shorts the body and source of the N-channel transistor. When both transistors are off, the body and source of the N-channel transistor are disconnected and a third transistor couples the body to a reference potential. The N-channel transistor and high voltage transistor share a common body in a semiconductor substrate. The source of the N-channel transistor provides an output terminal for the circuit. A number of these devices, each connected to a different supply voltage, can be connected to the same output terminal and selectively energized to form a voltage multiplexer.

18 Claims, 7 Drawing Sheets

FIELD EFFECT TRANSISTOR WITH SWITCHABLE BODY TO SOURCE CONNECTION

BACKGROUND OF THE INVENTION

1. Field of the Invention

This invention relates to circuits for preventing parasitic diodes in an MOS device from being undesirably forward biased.

2. Discussion of the Related Art

In a conventional NMOS transistor buffer circuit, the drain of the transistor is connected to a supply voltage, the body of the NMOS transistor is shorted to its source, and the source provides the output terminal for the buffer. If the transistor were in its off state and the output terminal were driven by an external power supply to a voltage that exceeded the NMOS transistor's drain voltage, the parasitic body/drain PN diode would become forward biased and clamp the transistor's output terminal to a voltage of one diode drop above the drain voltage. This forward biasing results in large currents flowing through the parasitic diode which may destroy the buffer circuit.

One solution to this problem is described in the U.S. Pat. No. 4,847,522 to Fuller et al. entitled "CMOS Amplifier/Driver Stage with Output Disable Feature." The pertinent Fuller et al. circuit and layout are shown in FIGS. 1A and 1B. Fuller et al. describe a protection circuit for NMOS transistor 10 to prevent its parasitic diodes from becoming forward biased. According to Fuller et al., the P-well substrate or body 16 (FIG. 1B) for transistors 10, 12 and 14 is switched to the most negative terminal of transistor 10 by transistors 12 and 14.

During operation of the Fuller et al. circuit, when the drain of transistor 10 is more positive than its source, transistor 14 is turned on, and P-well body 16 is connected to the source of transistor 10. When the drain of transistor 10 is more negative than its source, transistor 14 is turned off and transistor 12 is turned on thus connecting the P-well body 16 to the drain of transistor 10. Thus the P-well body 16 of transistor 10 is always at the most negative voltage in an attempt to prevent any forward biasing of either source or drain junctions.

Applicants have discovered some nonobvious drawbacks of the Fuller et al. circuit described above. Applicants have discovered that the Fuller et al. circuit can be used only in cases where the voltage at the source of transistor 10 is limited to approximately the sum of the sustaining breakdown voltage of transistor 14 (about 7 volts) and the voltage at the drain of transistor 10. If this maximum voltage limit is exceeded, transistors 10 and 14 fail due to excessive current drawn by the parasitic body-source diode of transistor 10 and body-drain diode of transistor 14. A similar failure may occur via transistor 12.

Applicants have found another problem with the Fuller et al. circuit. When transistor 10 is on, both transistors 12 and 14 could be off simultaneously whenever the voltages at the drain and source of transistor 10 are very nearly the same. In such cases, the P-well body 16 just floats, and current leaks through the parasitic bipolar N-P-N transistor formed of the source, body, and drain of transistor 10.

Thus there is need for a simple and effective structure which prevents the forward biasing of diodes in an FET and which does not suffer from the above-described drawbacks of the prior art.

SUMMARY OF THE INVENTION

In a preferred structure according to this invention, an N-channel field effect transistor's body and source are switchably connected via a high-voltage transistor. Use of a high-voltage transistor to provide the switchable body-source connection allows the source of the N-channel transistor to be driven to a high voltage because the high-voltage transistor has a much higher sustaining breakdown voltage as compared to the protected N-channel transistor.

The gates of the N-channel and high-voltage transistors are connected together. Thus, when the N-channel transistor is on, the high-voltage transistor is also on, and the body and source of the N-channel transistor are shorted through the high-voltage transistor. When the N-channel transistor is off, the high-voltage transistor is off so that the body and source of the N-channel transistor are disconnected.

An optional transistor may be used to connect the body of the N-channel transistor to ground when the N-channel transistor is off to prevent the body from floating.

In one embodiment, the high-voltage transistor is a lateral DMOS (LDMOS) transistor. The LDMOS transistor and the N-channel transistor are integrated in a unique structure using a unique method. In the integrated structure, a P-well body region of the N-channel transistor is formed in an N− epitaxial tub, and this body region is shared by the LDMOS transistor. The N+ source of the LDMOS transistor is formed adjacent to a P-well body contact region within the body region. The N+ drain contact region of the LDMOS transistor is formed in the N epitaxial tub. The gate of the LDMOS transistor is connected to the gate of the N-channel transistor.

The above described structures permit creation of a unique voltage multiplexer in which different voltage supplies, having a wide range of voltages, may be selectively controlled to be connected to a single output terminal.

DESCRIPTION OF THE PREFERRED EMBODIMENTS

Figure 2:
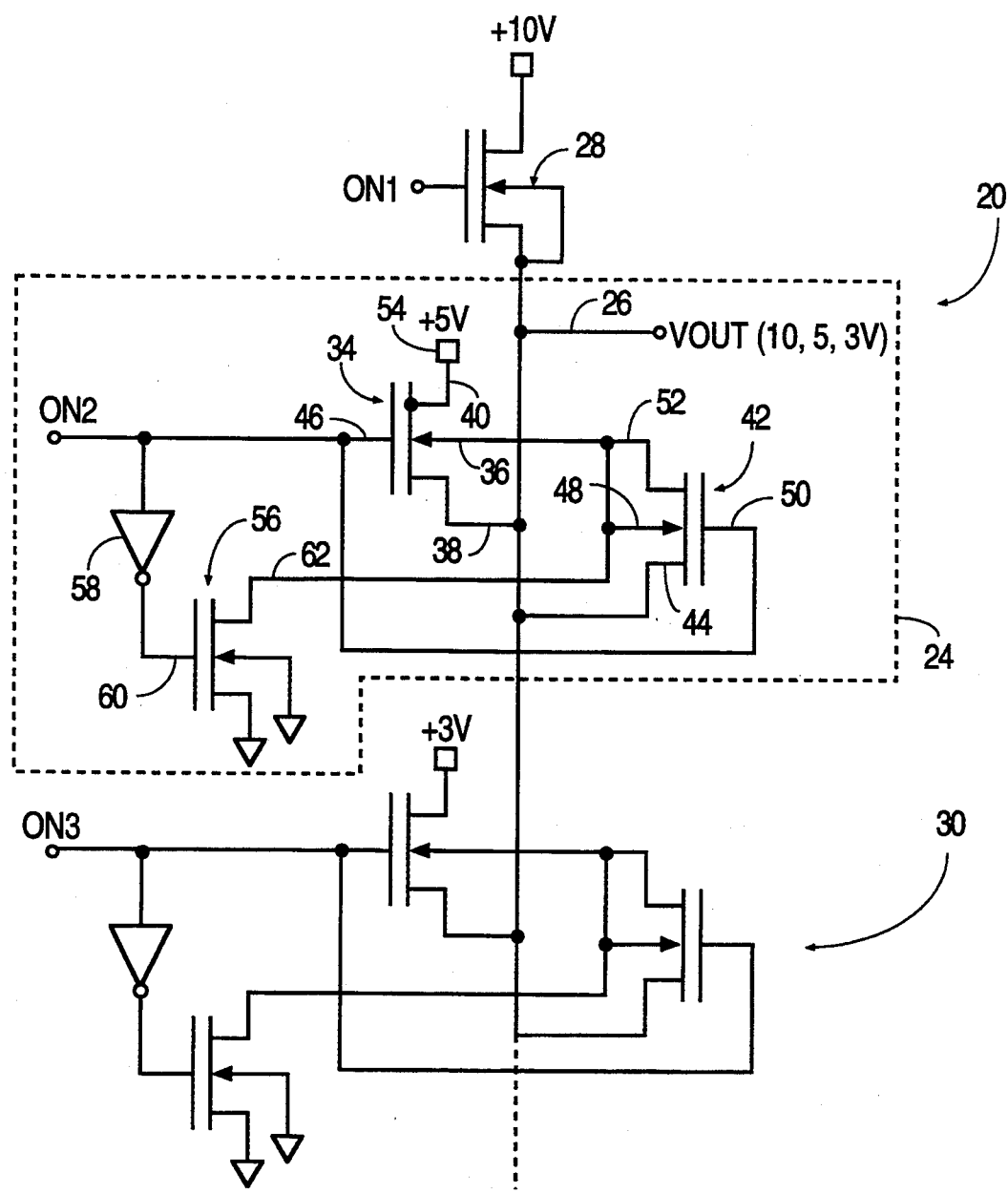
FIG. 2 illustrates a voltage multiplexer having three channels in accordance with the invention.

FIG. 2 shows a three-channel voltage multiplexer 20 which may selectively output any one of three voltages, 10 volts, 5 volts, or 3 volts, upon application of a high signal to one of control terminals ON1, ON2, or ON3. More channels may be added by duplicating circuit portion 24 and connecting the duplicated portion to output terminal 26.

In FIG. 2, N-channel transistor 28 has a drain coupled to a 10 volt supply and, when switched on by a high voltage applied to terminal ON1, provides approximately 10 volts to output terminal 26.

Portion 24, when enabled by a high voltage on control terminal ON2, provides approximately 5 volts to output terminal 26.

Similarly, portion 30, when enabled by a high voltage applied to terminal ON3, provides approximately 3 volts to output terminal 26.

Since portion 24 is identical to portion 30, only portion 24 will be described in detail.

The body 36 of N-channel transistor 34 in portion 24 cannot be permanently connected to its source 38 since, if transistor 34 is off and a voltage at output terminal 26 is greater than 5.7 volts (i.e., the drain voltage plus one diode drop), then the P-type body 36 would become forward biased with respect to the N-type drain 40. This would undesirably draw a high current through transistor 34 and limit the operation of the multiplexer 20. Transistor 34 may also be damaged by the high current.

The circuit portion 24 of FIG. 2 employs a body switching transistor 42 to prevent the forward biasing of the diodes in transistor 34 when the voltage applied to output terminal 26 is sufficiently above the 5 volts applied to the drain of transistor 34.

Figure 3:
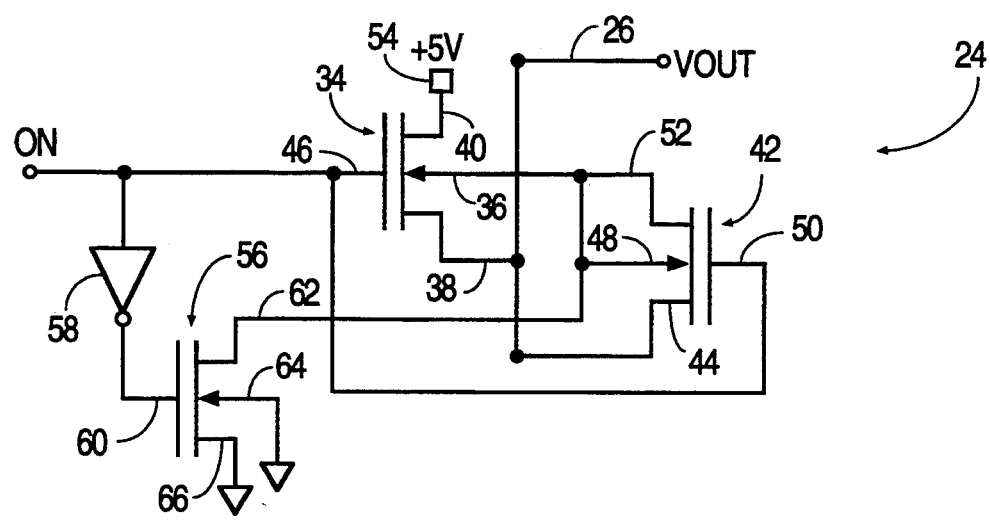
FIG. 3 illustrates a repeatable portion of the multiplexer of FIG. 2 which employs a high-voltage field effect transistor to provide a switchable body-to-source connection for an N-channel transistor.

To better understand the operation of circuit portion 24, circuit portion 24 has been isolated in FIG. 3.

In FIG. 3, the source 38 and body 36 of N-channel transistor 34 are switchably connected to each other by high-voltage field effect transistor 42. The source 38 of N-channel transistor 34 is connected to the drain 44 of high-voltage transistor 42. Body 36 and gate 46 of N-channel transistor 34 are connected respectively to body 48 and gate 50 of high-voltage transistor 42. Body 48 and source 52 of high-voltage transistor 42 are shorted together. Drain 40 of N-channel transistor 34 is connected to voltage supply terminal 54. Source 38 of N-channel transistor 34 is connected to output terminal 26.

During operation, since gates 46 and 50 of the two transistors are connected together, when N-channel transistor 34 is on, high-voltage transistor 42 is also on, and body 36 and source 38 of N-channel transistor 34 are shorted together through high-voltage transistor 42. When N-channel transistor 34 is off (and output terminal 26 is a high impedance), the high-voltage transistor 42 is off so that body 36 and source 38 of N-channel transistor 34 are disconnected. This disconnection of body 36 from source 38 prevents the forward biasing of the body-drain PN diode of N-channel transistor 34 when the 10 volt supply is coupled to output terminal 26 by transistor 28 (FIG. 2).

Moreover, when high-voltage transistor 42 is off, body 36 of N-channel transistor 34 may be switched to a reference potential using transistor 56 and inverter 58. The drain 62 of transistor 56 is connected to body 36 of transistor 34, while the body 64 and source 66 of transistor 56 are connected to ground. Body 36 is switched to ground when transistor 34 is off by connecting the gate 60 of transistor 56 to the output of inverter 58 so that transistor 56 is turned on when transistor 34 is turned off. Such a body 36 connection to ground when transistor 34 is off prevents body 36 from floating and serves to prevent leakage currents from flowing through transistor 34.

High-voltage transistor 42 may be any transistor that preferably has a sufficiently higher sustaining breakdown voltage than N-channel transistor 34. Depending on the specific application of the circuit and on techniques used to fabricate other components on the wafer, high-voltage transistor 42 may be a lateral double-diffused (LDMOS) field effect transistor, a self-aligned DMOS field effect transistor, a vertical DMOS field effect transistor, or a lateral P-channel MOS field effect transistor, all of which have higher sustaining breakdown voltages as compared to N-channel transistor 34. Although specific types of high-voltage transistors have been listed above, any transistor that has a high sustaining breakdown voltage as compared to N-channel transistor 34 may be used as high-voltage transistor 42 in accordance with this invention. The desired breakdown voltage of transistor 42 depends on the particular application of the circuit and the expected worst case voltages applied to the output terminal 26. Also, although in the embodiments illustrated by FIGS. 2 and 3, transistor 34 is shown as an N-channel field effect transistor, any other transistor (e.g., a PMOS transistor) may be employed as transistor 34 in accordance with this invention.

Figure 1A:
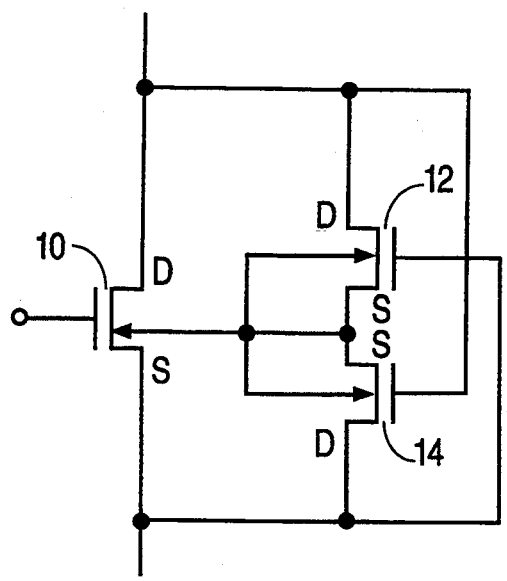
FIGS. 1A and 1B show a prior art circuit and layout of an N-channel transistor that has a switchable body to source connection.
Figure 1B:
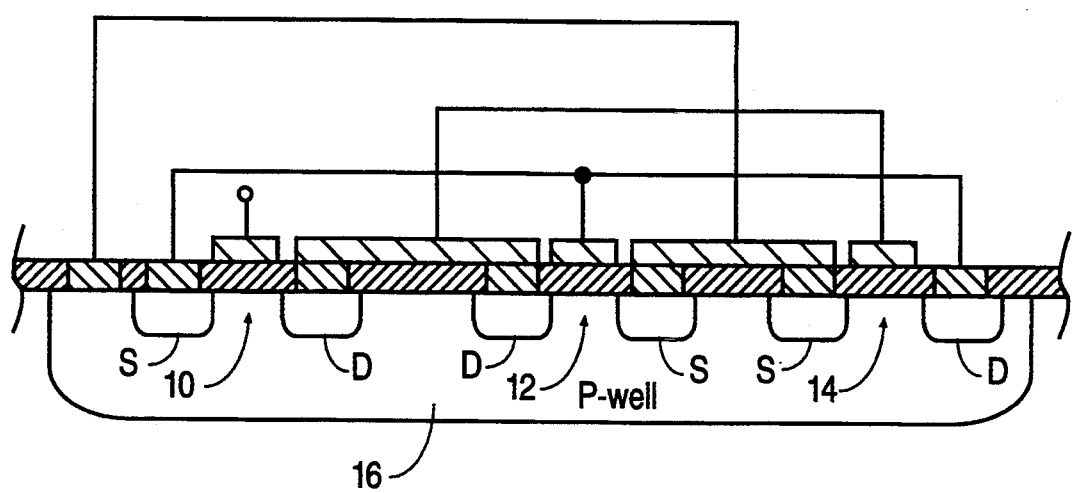

The switchable body to source connection provided by high-voltage transistor 42 has several advantages. Firstly, because of its high sustaining breakdown voltage, use of a high-voltage transistor as the substrate/body switching transistor allows the source of the high voltage transistor to be driven to a voltage greater than the sum of the drain voltage and the sustaining breakdown voltage of the prior art switching transistor 14 (FIG. 1A). Secondly, as discussed above, disconnection of the body and source by the high-voltage transistor 42 when the N-channel transistor 34 is off allows the source to avoid being clamped to a diode drop above the drain voltage if a high voltage is coupled to the output terminal 26. Thirdly, unlike the prior art, the switching transistor 42 is always turned on when the N-channel transistor 34 is turned on.

In one embodiment, high-voltage transistor 42 is a LDMOS transistor. An LDMOS transistor 42 has a sustaining breakdown voltage that is an order of magnitude higher than that of the N-channel transistor 34. Therefore, the transistor 42 no longer limits the voltage which may be applied to output terminal 26. The limit on the maximum voltage difference between terminals 54 and 26 when transistors 34 and 42 are off is now the reverse breakdown voltage of the inherent body-source diode of N-channel transistor 34 (approximately 25 V). Although this limits the maximum voltage difference, even this limit is sufficiently higher than the prior art limit of 7 volts.

Figure 4A:
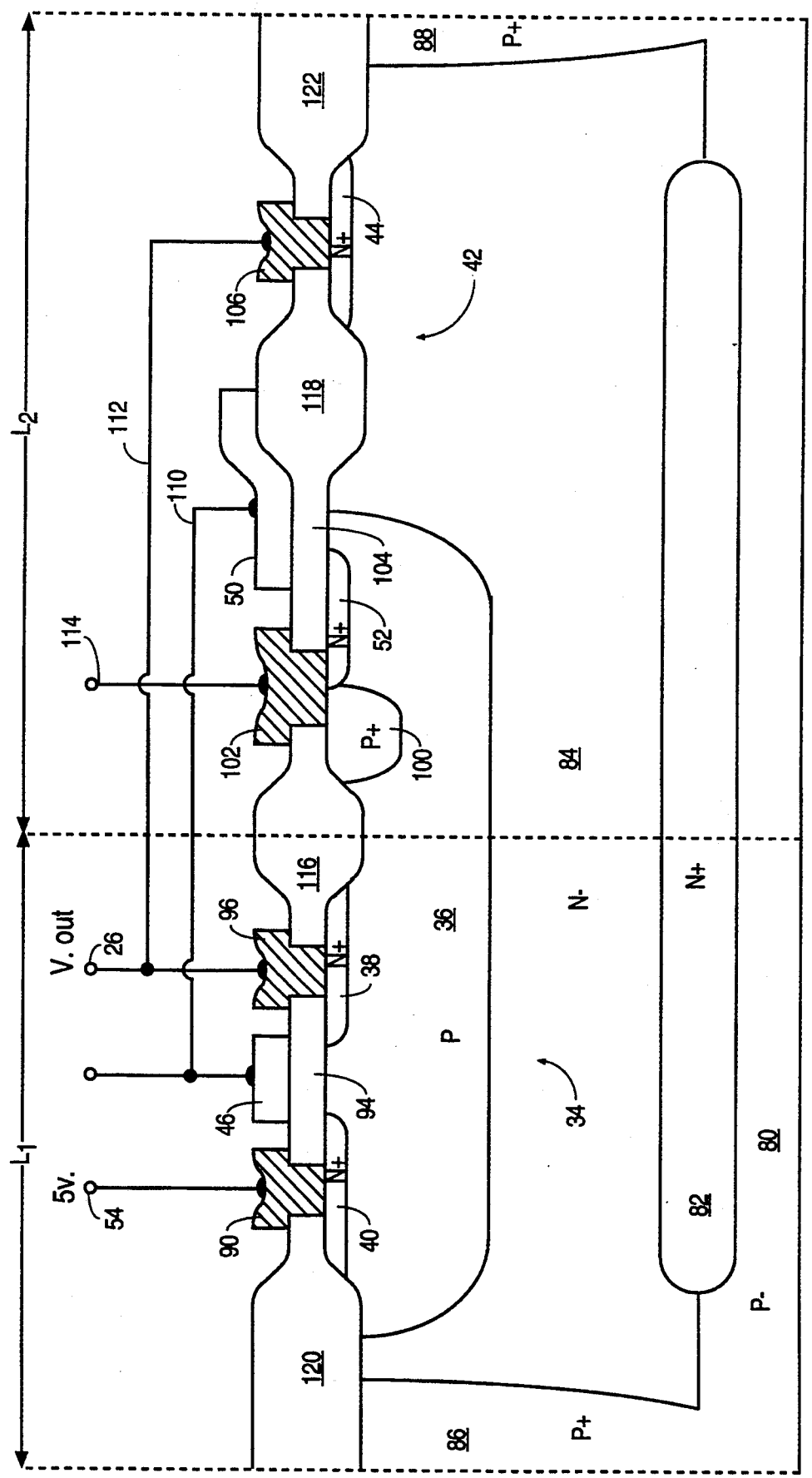
FIG. 4A is a cross-sectional view of a wafer illustrating an integrated circuit embodiment of a portion of the circuit in FIG. 3 using an LDMOS transistor.

Although the above-described embodiment using an LDMOS transistor 42 may be realized using discrete components, it is advantageous to use a single monolithic integrated circuit structure which integrates the N-channel transistor 34 and the LDMOS transistor 42. FIG. 4A illustrates an embodiment of this invention that integrates LDMOS transistor 42 and N-channel transistor 34 in a very compact structure. N-channel transistor 34 includes the components present in the left portion of FIG. 4A that span a length of $L_1$. LDMOS transistor 42 includes the components present in the right portion of FIG. 4A that span a length of $L_2$. Transistor 56 and inverter 58 in FIG. 3 are not shown for simplicity.

The dimensions of the transistors are dependent on the specific application of the circuit. In one example of the preferred embodiment, N-channel transistor 34 occupies about 2500 square mils while LDMOS transistor 42 occupies only about 50 square mils. The reason for the difference in sizes is that N-channel transistor 34 is used to switch large currents (e.g., up to 2 amps) while LDMOS transistor 42 only conducts the leakage currents between source 38 and body 36 of transistor 34.

As shown in FIG. 4A, substrate 80 is a lightly doped P− type substrate, while buried layer 82 is a heavily doped N+ type layer. Over buried layer 82 is provided an N type epitaxial tub 84.

N epitaxial tub 84 is surrounded by P+ isolation regions 86 and 88. In one embodiment, regions 86 and 88 are part of a single continuous annulus of a P type isolation region surrounding the N epitaxial tub 84. Within tub 84 is provided body 36 which is a lightly doped P-well that serves as a body region for both LDMOS transistor 42 and N-channel transistor 34.

N-channel transistor 34 includes drain region 40, which is a heavily doped N+ region formed within P-well body 36. A drain metal contact 90 provides proper electrical contact to drain 40.

N-channel transistor 34 has a gate 46 formed over gate oxide 94, which in turn is formed over body 36. The body 36 area under gate 46 forms the channel. In one embodiment, gate 46 is a polysilicon layer. In an alternative embodiment, gate 46 is a metallic layer.

N-channel transistor 34 includes a source 38, which is a heavily doped N+ region formed within body 36. A source metal contact 96 provides proper electrical contact to source 38.

A P+ body contact region 100 is formed in body 36 and is contacted by metal contact 102.

LDMOS transistor 42 includes a source 52 of a heavily doped N+ conductivity type formed within P-well body 36. Proper electrical contact to source 52 is provided by metal contact 102, which also provides the metal contact for body contact region 100, described above.

LDMOS transistor 42 includes a gate 50 formed over gate oxide 104. In one embodiment, gate 50 is a polysilicon layer. In an alternative embodiment, gate 50 may be a metallic layer.

The channel of LDMOS transistor 42 is formed within body 36 between the boundary of source 52 and the edge of body 36.

LDMOS transistor 42 includes a drain 44 which is a heavily doped N+ type region formed within N epitaxial tub 84. N epitaxial tub 84 serves as the drain extension of LDMOS transistor 42 and increases the breakdown voltage of LDMOS transistor 42. The avalanche breakdown of transistor 42 is about 100 V. A drain metal contact 106 provides proper electrical contact to drain 44.

Metal 110 connects gate 50 of LDMOS transistor 42 and gate 46 of N-channel transistor 34. Since the two gates 50 and 46 are connected in this manner, both transistors 34 and 42 are on or off simultaneously. Also, source 38 of N-channel transistor 34 is connected to drain 44 of LDMOS transistor 42 by metal 112.

The drain 62 (FIG. 3) of transistor 56 is connected to source 52 and body contact region 100 via metal 114 in the manner shown in FIG. 3.

Field oxide 116 separates source 38 from source 52 to prevent an unwanted channel between sources 38 and 52 when overlying metal lines are at a high voltage. Field oxide 118 increases the separation between the channel region and drain 44 to increase the breakdown voltage and prevents gate 50 from significantly modulating the conductivity of the epitaxial tub 84 under gate 50. Finally, field oxides 120 and 122 are provided to separate the transistors 34 and 42 from other components on the integrated circuit.

During operation, when N-channel transistor 34 and LDMOS transistor 42 are turned off, an external voltage may be coupled to output terminal 26 to raise source 38 to a much higher voltage than drain 40 without forward biasing the body/drain or body/source diodes in transistor 34. If metal 114 is optionally switched to ground via transistor 56 in FIG. 3 when transistor 34 is off, body 36 is grounded instead of floating to prevent any leakage current from flowing through transistor 34.

When transistors 34 and 42 are on, body 36 and source 38 are shorted through transistor 42, and transistor 34 operates normally to conduct current between terminals 54 and 26.

Although specific conductivity types have been described above, they may be opposite conductivity types in accordance with this invention. For example, substrate 80 may be of a N-type conductivity and the various diffused regions formed may be of an N-type or P-type conductivity. Also, LDMOS transistor 42 need not be formed within the same P-well body 36 as transistor 34 to realize the benefits of this invention. The various regions described above need not be formed self-aligned with the polysilicon gates, and any conventional technique may be used to form the various diffused regions and polysilicon gates. Geometries of the various diffused regions and conductive layers used to form the above described structures will of course depend upon the desired operating characteristics of the resulting structures. Note that in the preferred embodiment, the structure in FIG. 4A may form only a small part of a large integrated circuit (not shown).

The integrated structure described above with reference to FIG. 4A can be made using less die area than a discrete component embodiment of the circuit in FIGS. 2 or 3. For example, in the previous example where transistor 34 occupies 2500 square mils and transistor 42 occupies 50 square mils, the integration of N-channel transistor 34 and LDMOS transistor 42 into a merged structure results in a savings of at least 150 square mils of die area.

Additionally, in the past, two serially connected NMOS transistors with their bodies and sources connected together were used to prevent the body diode of the first transistor (connected to a supply voltage) from being forward biased when the drain of the second transistor was coupled to a high voltage. The circuit configuraton of FIGS. 3 and 4A is more efficient and dissipates less heat than these previous devices, since the die area and on-resistance of the single NMOS transistor 34 is only about half that of the serially connected power MOS transistors.

Referring back to FIG. 2, the transistors 28, 34, 42, and the two transistors in portion 30 corresponding to transistors 34 and 42 in portion 24, can be formed in the same epitaxial tub. Transistor 56 and the corresponding transistor in portion 30 should not be formed in the same tub as transistors 28, 34, and 42 since the body of transistor 56 is tied to ground. These transistors 56 are small, however.

Figure 4B:
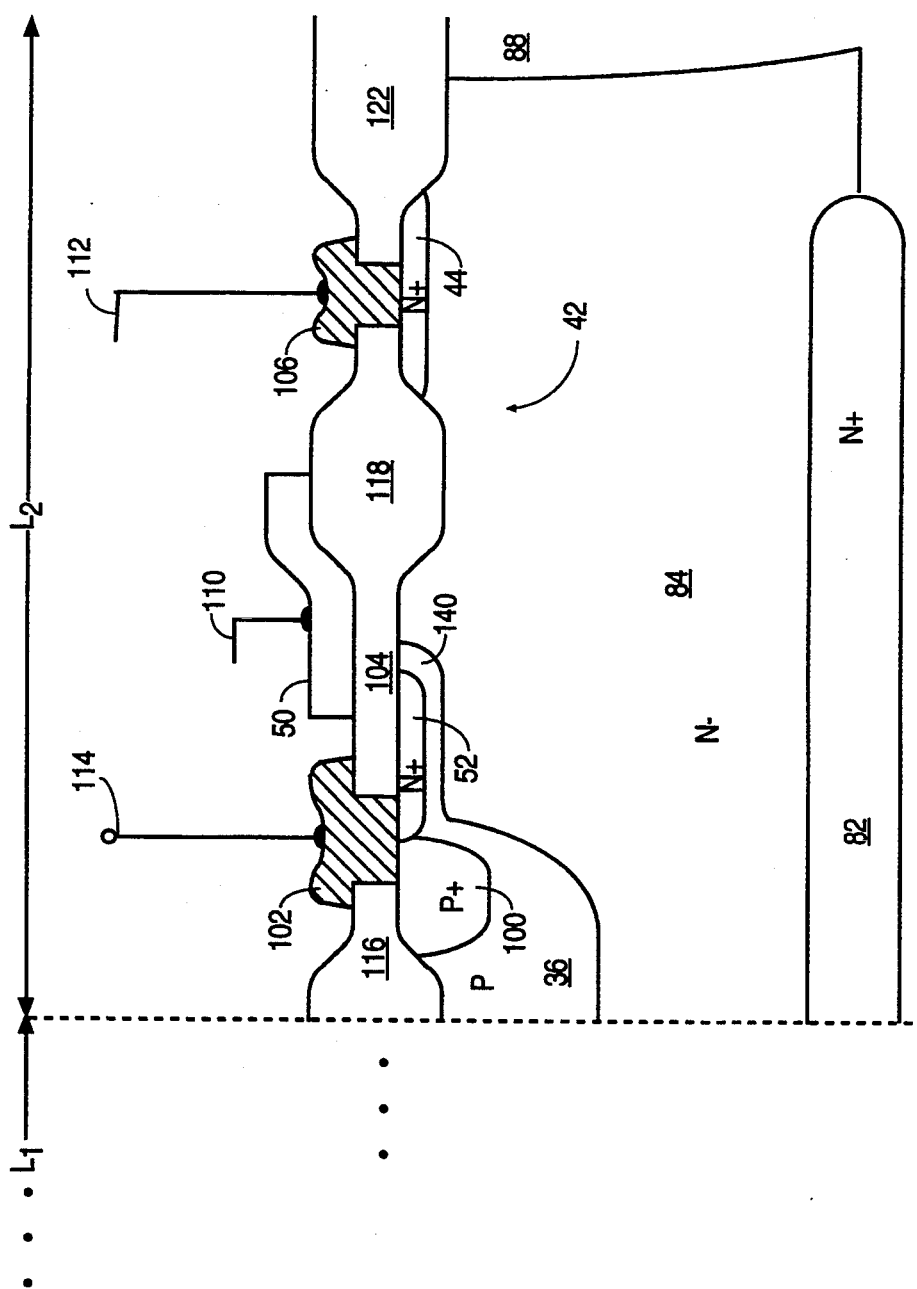
FIG. 4B is a cross-sectional view of a wafer illustrating another embodiment of a portion of the circuit in FIG. 3 using a self-aligned DMOS transistor.

FIG. 4B illustrates an embodiment similar to FIG. 4A (with only portion $L_2$ shown for simplicity) except the channel region for transistor 42 is formed using a self-aligned P-diffused region 140 where gate 50 acts as a mask for the diffused region 140. The connections between the gates and regions and other aspects of the structure are identical to those shown in FIG. 4A.

Figure 5:
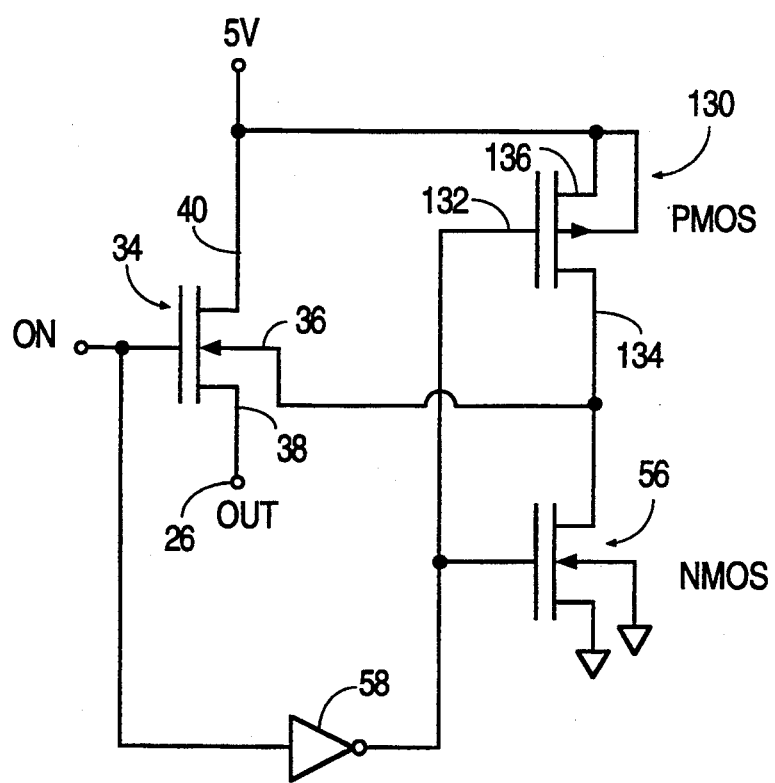
FIG. 5 illustrates a circuit similar to that of FIG. 3 but where a P-channel body-source switch is used.
Figure 6:
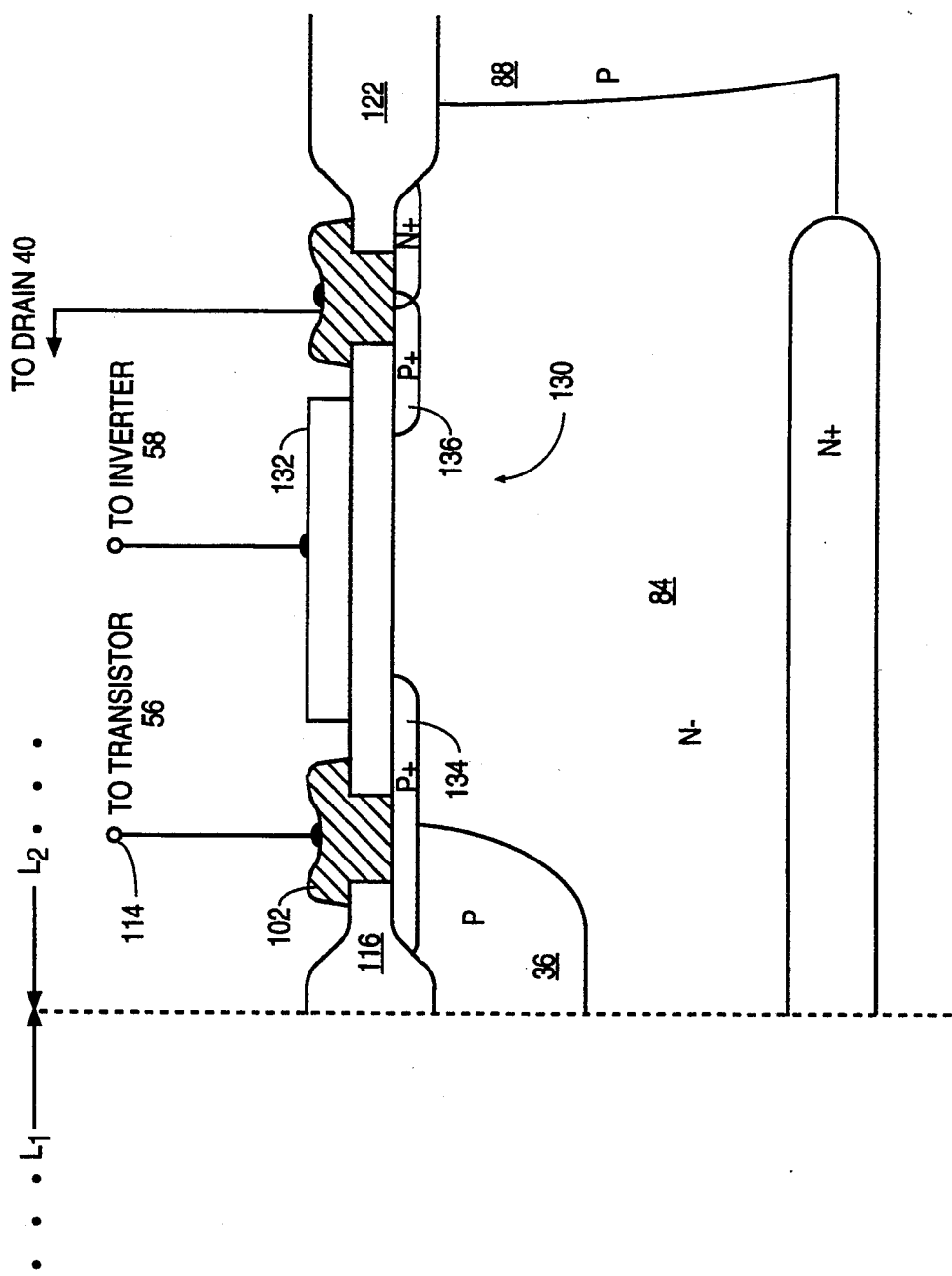
FIG. 6 is a cross-sectional view of a wafer illustrating a portion of the circuit of FIG. 5.

FIG. 5 illustrates a circuit similar to that of FIG. 3 except that the body switching transistor 130 is a P-channel type which is switched on along with transistor 34 by inverting the control voltage ON using inverter 58. In the circuit of FIG. 5, transistor 130 shorts the drain 40 of transistor 34 to body 36 when transistors 34 and 130 are on. The connections to gate 132, drain 134, and source 136 of transistor 130 are shown. The fabrication of this circuit would be understood by those skilled in the art after reading this disclosure. FIG. 6 illustrates the P-channel transistor 130 construction. The construction of transistor 34 would be similar to that shown in FIG. 4A.

Although the teachings of this invention find high applicability in forming the voltage multiplexer of FIG. 2, the teachings of this invention may be also used where appropriate to form any type of device which can utilize a field effect transistor with a switchable body to source connection.

The description of an embodiment of this invention is intended to be illustrative and not limiting. While particular embodiments of the present invention have been shown and described, it will be obvious to those skilled in the art that changes and modifications may be made without departing from this invention in its broader aspects. Therefore, the appended claims are to encompass within their scope all such changes and modifications as falling within the true spirit and scope of this invention.

What is claimed is:

1. A circuit comprising:
   a first field effect transistor (FET) having a first region of a first conductivity type, a second region of said first conductivity type, a body region of a second conductivity type between said first region and said second region, and a gate formed overlying said body region between said first region and said second region, wherein said second region is connected to a first voltage and said first region is connected to an output terminal of said circuit; and
   a second transistor connected between said first region and said body region of said first FET,
   a control terminal of said second transistor being connected to said gate of said first FET such that said first FET and said second transistor are simultaneously conductive or non-conductive.

2. The circuit of claim 1 wherein said first FET is an N-channel FET.

3. The circuit of claim 1 wherein said second transistor is a lateral double-diffused metal oxide semiconductor (LDMOS) FET.

4. The circuit of claim 1 wherein said second transistor is a self-aligned double-diffused metal oxide semiconductor (DMOS) FET.

5. The circuit of claim 1 wherein said second transistor is a lateral P-channel metal oxide semiconductor (PMOS) FET.

6. The circuit of claim 1 wherein said second transistor has a higher breakdown voltage than said first FET.

7. A circuit comprising:
   a first field effect transistor (FET) having a first region of a first conductivity type, a second region of said first conductivity type, a body region of a second conductivity type between said first region and said second region, and a gate formed overlying said body region between said first region and said second region;
   a second transistor connected between said first region and said body region of said first FET, a control terminal of said second transistor being connected to said gate of said first FET such that said first FET and said second transistor are simultaneously conductive or non-conductive; and
   a third transistor connected between said body region of said first FET and a reference voltage, said third transistor having a control terminal coupled to said gate of said first FET such that said third transistor is made conductive only when said first FET is non-conductive.

8. The circuit of claim 7 wherein said second transistor has a higher breakdown voltage than said first FET.

9. The circuit of claim 7 further comprising:
   a second FET substantially identical to said first FET, said second FET having a first region of said first conductivity type, a second region of said first conductivity type, a body region of said second conductivity type between said first region and said second region, and a gate formed overlying said body region between said first region and said second region; and
   a fourth transistor substantially identical to said second transistor, said fourth transistor being connected between said first region and said body region of said second FET, a control terminal of said fourth transistor being connected to said gate said second FET such that said second FET and said fourth transistor are simultaneously conductive or non-conductive,
   said first region of said second FET being connected to said first region of said first FET, said second region of said second FET being connected to a voltage which is different from a voltage connected to said second region of said first FET for forming a voltage multiplexer.

10. A circuit comprising:
    a first field effect transistor (FET) having a first region of a first conductivity type, a second region of said first conductivity type, a body region of a second conductivity type between said first region and said second region, and a gate formed overlying said body region between said first region and said second region; and
    a second transistor connected between said first region and said body region of said first FET, a control terminal of said second transistor being connected to said gate of said first FET such that said first FET and said second transistor are simultaneously conductive or non-conductive,
    wherein an output terminal of said circuit is connected to said first region, and said second region is connected to a first supply voltage, said output terminal having applied to it a voltage higher than said first supply voltage when said first FET is in a non-conductive state.

11. The circuit of claim 10 further comprising:
a second FET having a first region connected to said output terminal of said circuit, and having a second region connected to a second supply voltage,
whereby control voltages applied to respective gates of said first FET and said second FET control said first FET to apply said first supply voltage to said output terminal or control said second FET to apply said second supply voltage to said output terminal so that said circuit operates as a voltage multiplexer.

12. The circuit of claim 10 wherein said second transistor has a higher breakdown voltage than said first FET.

13. The circuit of claim 10 further comprising:
a second FET substantially identical to said first FET, said second FET having a first region of said first conductivity type, a second region of said first conductivity type, a body region of said second conductivity type between said first region and said second region, and a gate formed overlying said body region between said first region and said second region; and
a fourth transistor substantially identical to said second transistor, said fourth transistor being connected between said first region and said body region of said second FET, a control terminal of said fourth transistor being connected to said gate of said second FET such that said second FET and said fourth transistor are simultaneously conductive or non-conductive,
said first region of said second FET being connected to said first region of said first FET, said second region of said second FET being connected to a voltage which is different from a voltage connected to said second region of said first FET for forming a voltage multiplexer.

14. A circuit comprising:
a first field effect transistor (FET) having a first region of a first conductivity type, a second region of said first conductivity type, a body region of a second conductivity type between said first region and said second region, and a gate formed overlying said body region between said first region and said second region; and
a second transistor connected between said first region and said body region of said first FET,
a control terminal of said second transistor being connected to said gate of said first FET such that said first FET and said second transistor are simultaneously conductive or non-conductive,
wherein said first region and said second region are formed in said body region of said second conductivity type, said body region formed within a semiconductor material of said first conductivity type, said second transistor comprising a double-diffused MOS transistor having a third region of said first conductivity type formed in said body region, a portion of said body region forming a channel for said second transistor.

15. The circuit of claim 14 wherein said second transistor has a fourth region of a first conductivity type formed in said semiconductor material of said first conductivity type outside of said body region.

16. The circuit of claim 14 wherein said second transistor has a higher breakdown voltage than said first FET.

17. The circuit of claim 14 further comprising:
a second FET substantially identical to said first FET, said second FET having a first region of said first conductivity type, a second region of said first conductivity type, a body region of said second conductivity type between said first region and said second region, and a gate formed overlying said body region between said first region and said second region; and
a fourth transistor substantially identical to said second transistor, said fourth transistor being connected between said first region and said body region of said second FET, a control terminal of said fourth transistor being connected to said gate of said second FET such that said second FET and Said fourth transistor are simultaneously conductive or non-conductive,
said first region of said second FET being connected to said first region of said first FET, said second region of said second FET being connected to a voltage which is different from a voltage connected to said second region of said first FET for forming a voltage multiplexer.

18. A circuit comprising:
a first field effect transistor (FET) having a first region of a first conductivity type, a second region of said first conductivity type, a body region of a second conductivity type between said first region and said second region, and a gate formed overlying said body region beween said first region and said second region;
a second transistor connected between said first region and said body region of said first FET,
a control terminal of said second transistor being connected to said gate of said first FET such that said first FET and said second transistor are simultaneously conductive or non-conductive;
a second FET substantially identical to said first FET, said second FET having a first region of said first conductivity type, a second region of said first conductivity type, a body region of said second conductivity type between said first region and said second region, and a gate formed overlying said body region between said first region and said second region; and
a third transistor substantially identical to said second transistor, said third transistor being connected between said first region and said body region of said second FET, a control terminal of said third transistor being connected to said gate of said second FET such that said second FET and said third transistor are simultaneously conductive or non-conductive,
said first region of said second FET being connected to said first region of said first FET, said second region of said second FET being connected to a voltage which is different from a voltage connected to said seccond region of said first FET for forming a voltage multiplexer.

* * * * *